US011663847B2

United States Patent
Jin et al.

(10) Patent No.: US 11,663,847 B2
(45) Date of Patent: May 30, 2023

(54) ELECTRONIC DEVICE INCLUDING SENSOR PLACED UNDER DISPLAY

(71) Applicant: Samsung Electronics Co., Ltd., Gyeonggi-do (KR)

(72) Inventors: Yunjang Jin, Gyeonggi-do (KR); Suna Kim, Gyeonggi-do (KR); Seyoung Jang, Gyeonggi-do (KR); Cheolho Cheong, Gyeonggi-do (KR); Chihyun Cho, Gyeonggi-do (KR)

(73) Assignee: Samsung Electronics Co., Ltd

( * ) Notice: Subject to any disclaimer, the term of this patent is extended or adjusted under 35 U.S.C. 154(b) by 653 days.

(21) Appl. No.: 16/549,423

(22) Filed: Aug. 23, 2019

(65) Prior Publication Data

US 2020/0065542 A1 Feb. 27, 2020

(30) Foreign Application Priority Data

Aug. 23, 2018 (KR) .................. 10-2018-0098826

(51) Int. Cl.
*G06V 40/13* (2022.01)
*H01L 27/32* (2006.01)
(Continued)

(52) U.S. Cl.
CPC .......... *G06V 40/1306* (2022.01); *H01L 24/02* (2013.01); *H01L 24/26* (2013.01); *H01L 27/323* (2013.01); *H05K 1/118* (2013.01)

(58) Field of Classification Search
CPC ..... H04M 1/0266; H04M 1/026–0269; H04M 2250/12; H04M 1/23; H01L 27/323; H01L 27/3225; H01L 24/00–98; H01L 2224/00–98; H01L 29/786; G06V 40/1306; G06V 40/13–1394;
(Continued)

(56) References Cited

U.S. PATENT DOCUMENTS 10,133,908 B2 11/2018 Bai
10,211,421 B2 2/2019 Lee et al.
(Continued)

FOREIGN PATENT DOCUMENTS

JP 2017-001940 1/2017
KR 1020170073948 6/2017
(Continued)

OTHER PUBLICATIONS

European Search Report dated Dec. 3, 2021 issued in counterpart application No. 19852608.9-1216, 8 pages.
(Continued)

*Primary Examiner* — Amr A Awad
*Assistant Examiner* — Aaron Midkiff
(74) *Attorney, Agent, or Firm* — The Farrell Law Firm, P.C.

(57) ABSTRACT

An electronic device includes a display and a fingerprint sensor disposed under a specified area of the display. The fingerprint sensor is bonded to an inner surface of the display, through a bonding layer, and at least a portion of the bonding layer is expanded in a second direction different from a first direction facing the specified area and forms a protrusion structure to surround at least a portion of a side surface, which faces the second direction, of the fingerprint sensor.

19 Claims, 11 Drawing Sheets

(51) Int. Cl.
*H05K 1/11* (2006.01)
*H01L 23/00* (2006.01)

(58) Field of Classification Search
CPC ........ G06V 40/12–1306; G06K 9/0002; G06F 3/0412; G06F 3/042–0436; G06F 1/16–1698; G06F 21/32; G06F 2203/04107; G06F 3/041–04897; H05K 1/118; H05K 2201/10121–10136; H05K 2201/10151; H05K 1/0277–0283; H05K 5/0017; H05K 2201/05–058; C09J 7/29; G02F 1/133308; G02F 1/133322; G02F 1/13452; G02F 1/13454; G02F 1/23; G02F 2201/42

See application file for complete search history.

(56) References Cited

U.S. PATENT DOCUMENTS

| | | |
|---|---|---|
| 10,338,756 B2 | 7/2019 | Chen |
| 10,410,033 B2 | 9/2019 | He et al. |
| 10,410,036 B2 | 9/2019 | He et al. |
| 10,410,037 B2 | 9/2019 | He et al. |
| 10,442,151 B2 | 10/2019 | Ozeki et al. |
| 10,766,222 B2 | 9/2020 | Ozeki et al. |
| 11,003,884 B2 | 5/2021 | Buchan et al. |
| 2013/0328051 A1* | 12/2013 | Franklin ................ H05K 1/028 361/679.01 |
| 2016/0357294 A1* | 12/2016 | Ozeki .................... B32B 17/06 |
| 2017/0179424 A1* | 6/2017 | Lee ......................... H01L 51/56 |
| 2017/0364726 A1 | 12/2017 | Buchan et al. |
| 2018/0068153 A1 | 3/2018 | Bai |
| 2018/0151641 A1 | 5/2018 | Choo et al. |
| 2018/0188848 A1 | 7/2018 | Chen |
| 2018/0204040 A1 | 7/2018 | Kwon et al. |
| 2019/0205593 A1* | 7/2019 | Kim .................... H01L 27/3234 |
| 2019/0248098 A1 | 8/2019 | Ozeki et al. |

FOREIGN PATENT DOCUMENTS

| | | |
|---|---|---|
| KR | 1020180059720 | 6/2018 |
| WO | WO 2017/069523 | 4/2017 |
| WO | WO 2017/129126 | 8/2017 |

OTHER PUBLICATIONS

International Search Report dated Dec. 20, 2019 issued in counterpart application No. PCT/KR2019/010809, 11 pages.
Korean Office Action dated Sep. 21, 2022 issued in counterpart application No. 10-2018-0098826, 12 pages.
Korean Office Action dated Nov. 28, 2022 issued in counterpart application No. 10-2018-0098826, 6 pages.
European Search Report dated Mar. 23, 2023 issued in counterpart application No. 19852608.9-1224, 4 pages.

* cited by examiner

ELECTRONIC DEVICE INCLUDING SENSOR PLACED UNDER DISPLAY

CROSS-REFERENCE TO RELATED APPLICATION(S)

This application is based on and claims priority under 35 U.S.C. § 119 to Korean Patent Application No. 10-2018-0098826, filed on Aug. 23, 2018, in the Korean Intellectual Property Office, the disclosure of which is incorporated by reference herein its entirety.

BACKGROUND

1. Field

The present disclosure relates generally to an electronic device including a sensor placed under a display.

2. Description of Related Art

An electronic device, such as a smartphone, a tablet personal computer (PC), or a smart watch may include various sensors. For example, the electronic device may collect bio-information of a user through a fingerprint sensor or a biometric sensor. The electronic device may provide various functions (e.g., screen unlocking, or running of a financial application) associated with security for a user by analyzing information collected through a sensor.

An electronic device may include a fingerprint sensor on a front surface or a rear surface thereof. Recently, attempts have been made to mount a fingerprint sensor on a portion of an active area of a display (hereinafter, an IN-DISPLAY). The fingerprint sensor in the IN-DISPLAY may include an optical fingerprint sensor or an ultrasonic fingerprint sensor.

When the electronic device including the IN-DISPLAY fingerprint sensor operates as an ultrasonic type, the path of an ultrasonic wave may be changed by an air layer included inside the display panel. Accordingly, the efficiency of receiving an ultrasonic wave by the fingerprint sensor may be degraded and the performance of recognizing the fingerprint by the fingerprint sensor may be degraded.

SUMMARY

The present disclosure has been made to address the above-mentioned problems and disadvantages, and to provide at least the advantages described below In accordance with an aspect of the present disclosure, an electronic device includes a display and a fingerprint sensor disposed under a specified area of the display. The fingerprint sensor may be bonded to an inner surface of the display, through a bonding layer, and at least a portion of the bonding layer is expanded in a second direction different from a first direction facing the specified area and forms a protrusion structure to surround at least a portion of a side surface, which faces the second direction, of the fingerprint sensor.

In accordance with another aspect of the present disclosure, an electronic device includes a first sensor, a second sensor, and a display module. The display module may include a first opaque layer disposed under the flexible layer and including a second opening aligned with the first opening and a third opening spaced apart from the second opening. The display module may further include a second opaque layer disposed under the flexible layer through the third opening. The first sensor may be disposed to pass through the first opening and the second opening, and the second sensor may be disposed under the second opaque layer through the third opening.

BRIEF DESCRIPTION OF THE DRAWINGS

The above and other aspects, features, and advantages of certain embodiments of the present disclosure will be more apparent from the following description taken in conjunction with the accompanying drawings, in which.

DETAILED DESCRIPTION

Figure 1:
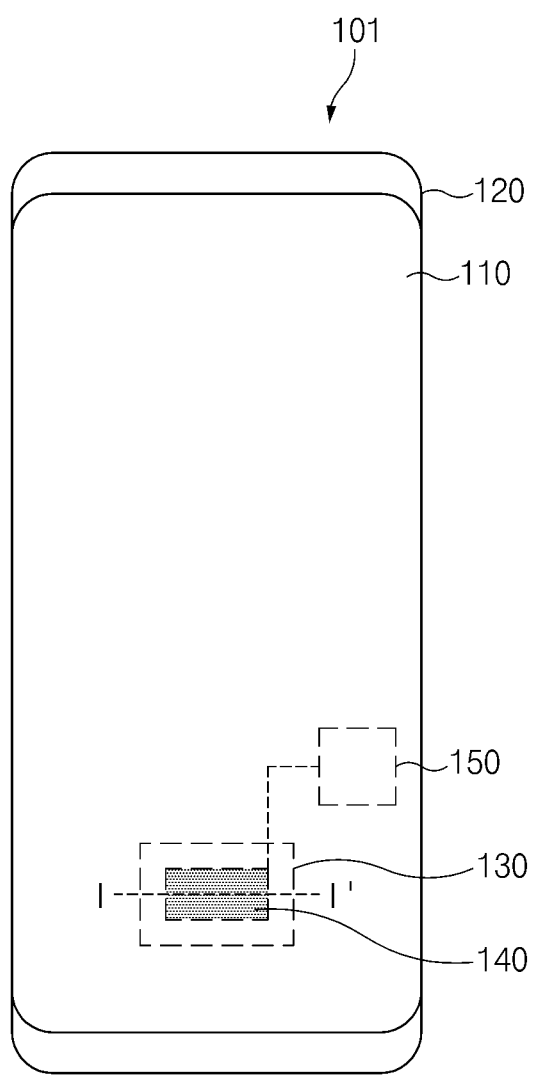
FIG. 1 illustrates an electronic device capable of recognizing an external object using a partial region of a display, according to an embodiment.

Hereinafter, various embodiments of the present disclosure will be described with reference to the accompanying drawings. Accordingly, those of ordinary skill in the art will recognize that modification, equivalent, and/or alternative on the various embodiments described herein can be variously made without departing from the scope and spirit of the present disclosure. With regard to description of drawings, similar components may be marked by similar reference numerals.

In the disclosure disclosed herein, the expressions "have", "may have", "include" and "comprise", or "may include" and "may comprise" used herein indicate existence of corresponding features (for example, elements such as numeric values, functions, operations, or components) but do not exclude presence of additional features.

In the disclosure disclosed herein, the expressions "A or B", "at least one of A or/and B", or "one or more of A or/and B", and the like used herein may include any and all combinations of one or more of the associated listed items. For example, the term "A or B", "at least one of A and B", or "at least one of A or B" may refer to all of the case (1) where at least one A is included, the case (2) where at least one B is included, or the case (3) where both of at least one A and at least one B are included.

The terms, such as "first", "second", and the like used herein may refer to various elements of various embodiments of the present disclosure, but do not limit the elements. For example, such terms are used only to distinguish an element from another element and do not limit the order and/or priority of the elements. For example, a first user device and a second user device may represent different user devices irrespective of sequence or importance. For example, without departing the scope of the present disclosure, a first element may be referred to as a second element, and similarly, a second element may be referred to as a first element.

It will be understood that when an element (for example, a first element) is referred to as being "(operatively or communicatively) coupled with/to" or "connected to" another element (for example, a second element), it can be directly coupled with/to or connected to the other element or an intervening element (for example, a third element) may be present. In contrast, when an element (for example, a first element) is referred to as being "directly coupled with/to" or "directly connected to" another element (for example, a second element), it should be understood that there are no intervening element (for example, a third element).

According to the situation, the expression "configured to" used herein may be used as, for example, the expression "suitable for", "having the capacity to", "designed to", "adapted to", "made to", or "capable of". The term "configured to (or set to)" must not mean only "specifically designed to" in hardware. Instead, the expression "a device configured to" may mean that the device is "capable of" operating together with another device or other components. CPU, for example, a "processor configured to (or set to) perform A, B, and C" may mean a dedicated processor (for example, an embedded processor) for performing a corresponding operation or a generic-purpose processor (for example, a central processing unit (CPU) or an application processor) which may perform corresponding operations by executing one or more software programs which are stored in a memory device.

Terms used in this specification are used to describe specified embodiments of the present disclosure and are not intended to limit the scope of the present disclosure. The terms of a singular form may include plural forms unless otherwise specified. Unless otherwise defined herein, all the terms used herein, which include technical or scientific terms, may have the same meaning that is generally understood by a person skilled in the art. It will be further understood that terms, which are defined in a dictionary and commonly used, should also be interpreted as is customary in the relevant related art and not in an idealized or overly formal detect unless expressly so defined herein in various embodiments of the present disclosure. In some cases, even if terms are terms which are defined in the specification, they may not be interpreted to exclude embodiments of the present disclosure.

An electronic device according to various embodiments of the present disclosure may include at least one of smartphones, tablet personal computers (PCs), mobile phones, video telephones, electronic book readers, desktop PCs, laptop PCs, netbook computers, workstations, servers, personal digital assistants (PDAs), portable multimedia players (PMPs), MP3 players, mobile medical devices, cameras, and wearable devices. According to various embodiments of the present disclosure, the wearable devices may include accessories (for example, watches, rings, bracelets, ankle bracelets, glasses, contact lenses, or head-mounted devices (HMDs)), cloth-integrated types (for example, electronic clothes), body-attached types (for example, skin pads or tattoos), or implantable types (for example, implantable circuits).

In some embodiments of the present disclosure, the electronic device may be one of home appliances. The home appliances may include, for example, at least one of a digital video disk (DVD) player, an audio, a refrigerator, an air conditioner, a cleaner, an oven, a microwave oven, a washing machine, an air cleaner, a set-top box, a home automation control panel, a security control panel, a TV box (for example, Samsung HomeSync™, Apple TV™, or Google TV™), a game console (for example, Xbox™ or PlayStation™), an electronic dictionary, an electronic key, a camcorder, or an electronic panel.

In another embodiment of the present disclosure, the electronic device may include at least one of various medical devices (for example, various portable medical measurement devices (a blood glucose meter, a heart rate measuring device, a blood pressure measuring device, and a body temperature measuring device), a magnetic resonance angiography (MRA), a magnetic resonance imaging (MRI) device, a computed tomography (CT) device, a photographing device, and an ultrasonic device), a navigation system, a global navigation satellite system (GNSS), an event data recorder (EDR), a flight data recorder (FDR), a vehicular infotainment device, electronic devices for vessels (for example, a navigation device for vessels and a gyro compass), avionics, a security device, a vehicular head unit, an industrial or home robot, an automatic teller's machine (ATM) of a financial company, a point of sales (POS) of a store, or an internet of things (for example, a bulb, various sensors, an electricity or gas meter, a spring cooler device, a fire alarm device, a thermostat, an electric pole, a toaster, a sporting apparatus, a hot water tank, a heater, and a boiler).

According to some embodiments of the present disclosure, the electronic device may include at least one of a furniture or a part of a building/structure, an electronic board, an electronic signature receiving device, a projector, or various measurement devices (for example, a water service, electricity, gas, or electric wave measuring device). In various embodiments of the present disclosure, the electronic device may be one or a combination of the aforementioned devices. The electronic device according to some embodiments of the present disclosure may be a flexible electronic device. Further, the electronic device according to an embodiment of the present disclosure is not limited to the aforementioned devices, but may include new electronic devices produced due to the development of technologies.

Hereinafter, electronic devices according to an embodiment of the present disclosure will be described with reference to the accompanying drawings. The term "user" used herein may refer to a person who uses an electronic device or may refer to a device (for example, an artificial electronic device) that uses an electronic device.

FIG. 1 illustrates an electronic device capable of recognizing an external object using a partial region of a display, according to an embodiment. The following description will be made with reference to FIG. 1 while assuming that the external object is a fingerprint of a user, but the external object is not limited thereto.

Referring to FIG. 1, an electronic device 101 includes a display (e.g., a display module) 110 and a main body 120 (e.g., a housing or frame).

The display 110 may include, for example, a liquid crystal display (LCD), a light-emitting diode (LED) display, an organic LED (OLED) display, a microelectromechanical systems (MEMS) display, or an electronic paper display. The display 110 may display, for example, various pieces of content (e.g., a text, an image, a video, an icon, and/or a symbol) for a user. The display 110 may include a touch screen and may receive, for example, a touch, a gesture, a proximity input, or a hovering input using an electronic pen or a part of the body of the user. The display 110 may include a glass cover (e.g., a window panel) exposed to the outside of the electronic device 101 and various internal layers.

The display 110 may be arranged to occupy an entire portion (BEZEL-LESS) or a part of a front surface (e.g., a surface to output content through the display 110, or a surface to dispose an active area of the display 110) of the electronic device 101. The display 110 may be expanded to side surfaces (e.g., top/bottom/left/right surfaces) of the electronic device 101.

The display 110 may include a fingerprint recognizing area 130 formed in at least a portion thereof (IN-DISPLAY). When the finger of the user is placed on the fingerprint recognizing area 130, the fingerprint recognizing area 130 may collect fingerprint information by using a sound wave reflected from the fingerprint of the user's finger.

The fingerprint recognizing area 130 may be located at a position for easily disposing a thumb of a user, when the user holds the electronic device 101, which is in a vertical mode (or portrait mode), using one hand.

The fingerprint recognizing area 130 may output content, such as a text or an image, identically to how content is output on other parts of the display 110, when the fingerprint recognizing area 130 does not perform a fingerprint recognition function. When the process of recognizing the fingerprint is executed, the fingerprint recognizing area 130 may be displayed in a different color than another area of the display 110, or may be displayed in the state of being illuminated (the state in which light is emitted from a pixel inside the display 110).

The electronic device 101 may include a fingerprint sensor 140 to recognize an external object using an ultrasonic wave inside the fingerprint recognizing area 130.

The fingerprint sensor 140 may generate an ultrasonic wave toward the fingerprint recognizing area 130. The fingerprint sensor 140 may collect a sound wave reflected from the external object (e.g., the finger of the user) to transform the sound wave into a digital image. For example, the fingerprint sensor 140 may obtain a background image or an image including the fingerprint of the user, by capturing a plurality of image frames for a specific time. For example, the fingerprint sensor 140 may capture one image frame within about 40 milliseconds (msec) by using the ultrasonic wave.

A processor 150 may perform various operations. For example, the processor 150 may run software to control at least one other component (e.g., a hardware or software component) connected with the processor 150 and may process and compute various data.

The processor 150 may control the process of the fingerprint sensor 140 of recognizing the fingerprint by generating a signal for controlling the fingerprint sensor 140. For example, the processor 150 may control the fingerprint sensor 140 to generate an ultrasonic wave for fingerprint recognition and to collect a wave reflected from the external object. The processor 150 may perform various functions (e.g., payment, banking, or screen unlocking), based on an image provided by the fingerprint sensor 140.

The main body 120 may have the display 110 mounted thereon and allow an active area of the display 110 to be mainly disposed toward the first surface (front surface). The main body 120 may include various components (e.g., the processor 150, a memory, a communication circuitry, a battery, or a substrate) to drive the electronic device 101.

Figure 2:
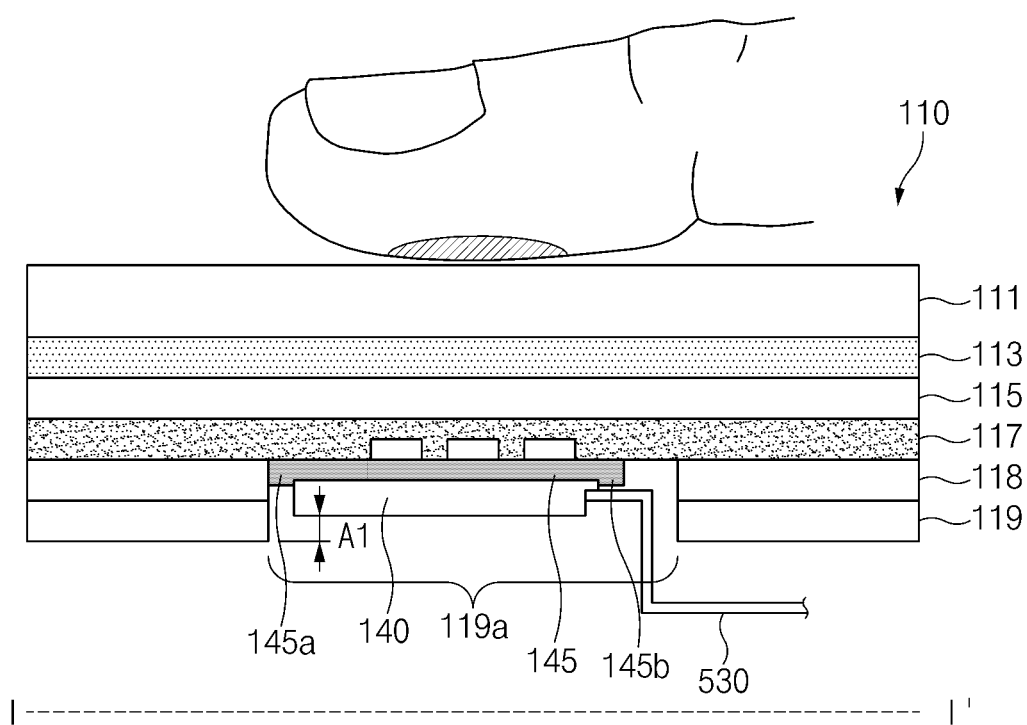
FIG. 2 is a cross-sectional view illustrating a fingerprint recognizing area of an electronic device, according to an embodiment.

FIG. 2 is a cross-sectional view illustrating the fingerprint recognizing area of the electronic device, according to an embodiment. FIG. 2 may be a cross-sectional view taken along line I-I' of FIG. 1.

Referring to FIG. 2, the display 110 may include various layers. For example, the display 110 has a structure in which a transparent layer (e.g., a window panel or a glass plane) 111, a bonding layer 113, a polarizing layer 115, a display panel 117, a protective layer 118, and a suppressing layer 119 are sequentially stacked. FIG. 2 is provided by way of example, but the disclosure is not limited thereto. In the display 110, some layers may be added or may be omitted. For example, the display 110 may further include a touch panel.

The transparent layer (e.g., the window panel or the glass panel) 111 may be provided at the uppermost end (the surface of the electronic device 101) of the display 110. The transparent layer 111 may protect internal components of the display 110. The light emitted from the display panel 117 may be output to the outside of the electronic device 101 through the transparent layer 111.

The bonding layer 113 may bond the transparent layer 111 to the polarizing layer 115. For example, the bonding layer 113 may include an optically clear adhesive (OCA) film or a double-sided adhesive tape.

The polarizing layer 115 may polarize light introduced from the outside and may transmit light oscillating along a linear locus thereof. The polarizing layer 115 may block light which is not matched with a specified linear locus.

The display panel 117 may be a layer to emit light in response to an electrical signal. The display panel 117 may include a substrate layer, a light emitting layer, and an encapsulating layer. For example, the display panel 117 may have a form obtained by depositing a light emitting device (e.g., an electroluminescence (EL) device) on a polyimide (PI) substrate. The PI substrate may include a metal wire or an insulating film to drive each pixel of an active area. The EL may generate light when holes and electrons are introduced into the EL from a cathode and an anode, respectively. The light emitting device may be covered by a structure formed by stacking an inorganic layer and an organic layer of at least three layers through a thin film encapsulating (TFE) layer (as illustrated in FIG. 3).

An air layer or void may not be included in the layers of the display 110 disposed on the fingerprint sensor 140. The air layer or the void may interrupt the ultrasonic wave, which is generated from the fingerprint sensor 140, from travelling by reflecting or refracting the ultrasonic wave. For example, the acoustic impedance of the air is significantly different from that of the materials of the layers of the display 110 disposed on the fingerprint sensor 140. Accordingly, most of the sound wave generated from the fingerprint sensor 140 may be reflected from the air layer.

The protective layer 118 may be a film layer to protect the rear surface of the display panel 117. The protective layer 118 may prevent the display panel 117 from colliding with internal components of the electronic device. The protective layer 118 may include an embossed layer to reduce impact through a structural feature of the embossed form, and a cushion layer to reduce the impact through a material feature. The protective layer 118 may be a dark (e.g., black) opaque layer.

The suppressing layer 119 may suppress heat or an electromagnetic wave generated from the display panel 117. For example, the suppressing layer 119 may include a copper (Cu) sheet.

The fingerprint sensor 140 (e.g., an image sensor) may be mounted on an inner surface (e.g., an inner surface corresponding to the fingerprint recognizing area 130 of FIG. 1) of the display 110. A surface (e.g., a sensing surface), which is used to collect the sound wave, of the fingerprint sensor 140 may be disposed toward the display panel 117.

The fingerprint sensor 140 may be mounted on a part, which does not have layers, of the rear surface of the display 110. For example, the fingerprint sensor 140 may be disposed in an area in which the protective layer 118 and the suppressing layer 119 are removed from a lower portion of the display panel 117. The protective layer 118 and the suppressing layer 119 may have a hole (e.g., an opening) 119a formed in an area adjacent to the fingerprint sensor 140. The fingerprint sensor 140 may be disposed inside the opening 119a.

Although FIG. 2 illustrates that part of the protective layer 118 and the suppressing layer 119 is removed and the fingerprint sensor 140 is mounted. However, the fingerprint sensor 140 may also be mounted in a state in which the protective layer 118 is removed and the suppressing layer 119 is maintained. In addition, the fingerprint sensor 140 may be included in a set of layers at a lower portion of the display panel 117 as the thickness of the set of layers is reduced.

The fingerprint sensor 140 may be bonded to a bottom surface (e.g., an opposite surface of an active area of the display 110 or the surface facing the back cover of the electronic device 101) of the display panel 117 through a sensor bonding layer 145.

The sensor bonding layer 145 may be formed by hardening a liquid-phase material having an adhesive property. For example, the sensor bonding layer 145 may include resin, an OCA, a film or a double-sided adhesive tape. A film or resin-type adhesive liquid may be applied to the bottom surface of the display panel 117. When the fingerprint sensor 140 is seated and pressed on the applied adhesive liquid, the adhesive liquid may be spread and planarized. The planarized adhesive liquid is hardened to form the sensor bonding layer 145. The sensor bonding layer 145 may be optically opaque (e.g., black).

The sensor bonding layer 145 may include a protrusion structures (hereinafter, fillet structure 145a and 145b) which is formed to cover at least a portion of the side surface (e.g., the surface facing the side of the electronic device 101) of the fingerprint sensor 140. The fillet structures 145a and 145b may be formed in the process of planarizing the adhesive liquid. The fillet structures 145a and 145b may reduce the ultrasonic signal which is diffuse reflected to the side surface of the fingerprint sensor 140, thereby enhancing the fingerprint recognition performance.

The fillet structures 145a and 145b may be formed on all four surfaces of the fingerprint sensor 140 or three surfaces of the fingerprint sensor 140.

The fingerprint sensor 140 may be electrically connected with internal components (e.g., a printed circuit board (PCB)) of the electronic device 101 through a wiring part 530. The wiring part 530 may be a portion of a flexible PCB (FPCB).

The first fillet structure 145a may make contact with the protective layer 118 and the suppressing layer 119 adjacent thereto, on one side surface of the fingerprint sensor 140. The second fillet structure 145b may not make contact with the protective layer 118 and the suppressing layer 119 adjacent thereto, on another side surface of the fingerprint sensor 140. The second fillet structure 145b may be disposed adjacent to the wiring part 530. The first fillet structure 145a and the second fillet structure 145b may have different heights. For example, the height of the first fillet structure 145a may be higher than the height of the second fillet structure 145b adjacent to the wiring part 530.

The second fillet structure 145b may be formed at an area that is not adjacent to the wiring part 530.

The fingerprint sensor 140 may include an ultrasonic wave oscillating unit and an ultrasonic wave receiving unit. The fingerprint sensor 140 may generate an ultrasonic wave having a specified frequency for fingerprint recognition through the ultrasonic wave oscillating unit. The fingerprint sensor 140 may collect a reflected sound wave (reflection wave) corresponding to an ultrasonic wave having a specified frequency, which is reflected from the external object, through the ultrasonic wave receiving unit. The fingerprint sensor 140 may convert the reflected wave into an electrical signal and may generate a digital image based on the electrical signal. The fingerprint sensor 140 may capture a plurality of image frames at a specified period of time and may obtain a sensing image based on the captured image frames.

The rear surface (the surface facing the back cover of the electronic device 101 or an opposite surface to a surface facing the fingerprint recognizing area 130) of the fingerprint sensor 140 may be planarized. The fingerprint sensor 140 may have an air layer (or air gap) A1 formed on the rear surface thereof and spaced apart from a support member (e.g., a bracket or a metal sheet) by a specified distance (e.g., about 2 micrometers (um)) or more, without making contact with the support member (e.g., the bracket or the metal sheet). The ultrasonic wave emitted through the rear surface of the fingerprint sensor 140 is totally reflected from the air layer A1 toward the fingerprint recognizing area 130.

Figure 3A:
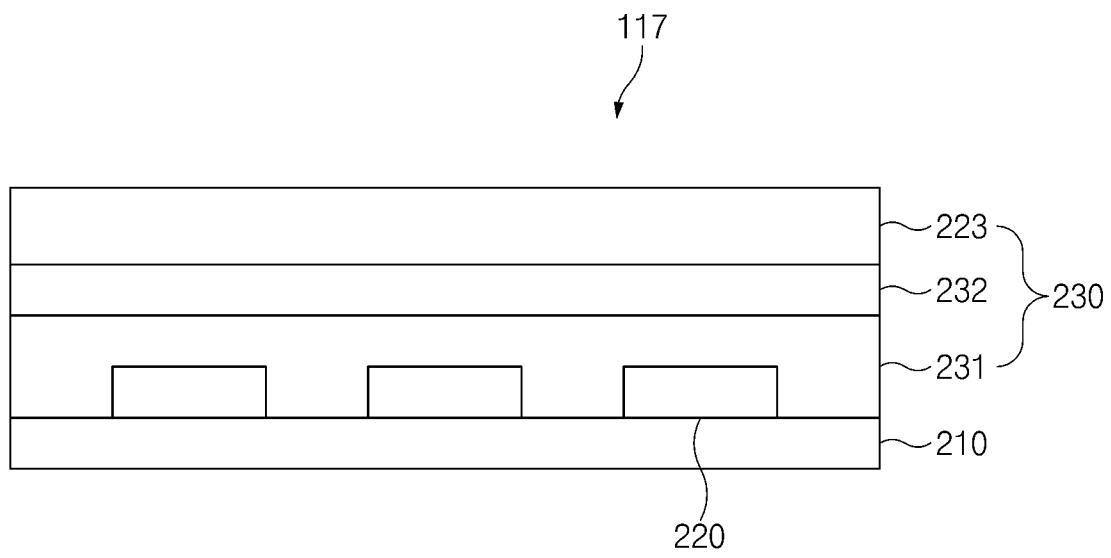
FIGS. 3A, 3B and 3C illustrate the structure of a display panel, according to various embodiments.
Figure 3B:
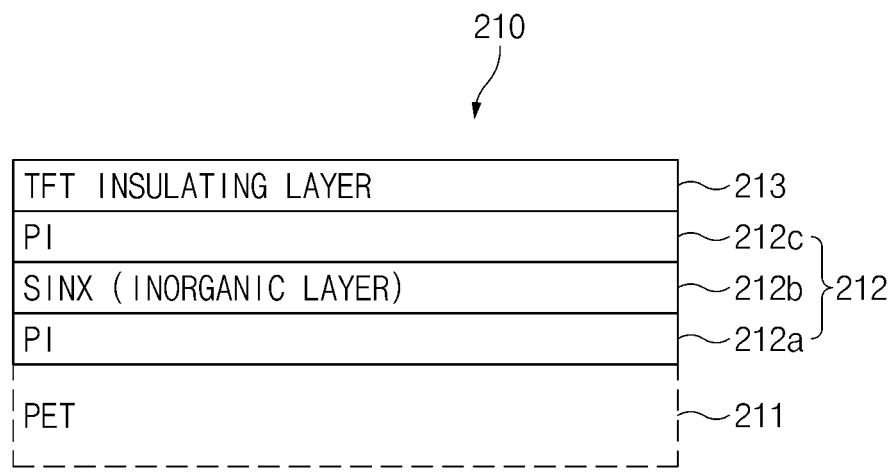
Figure 3C:
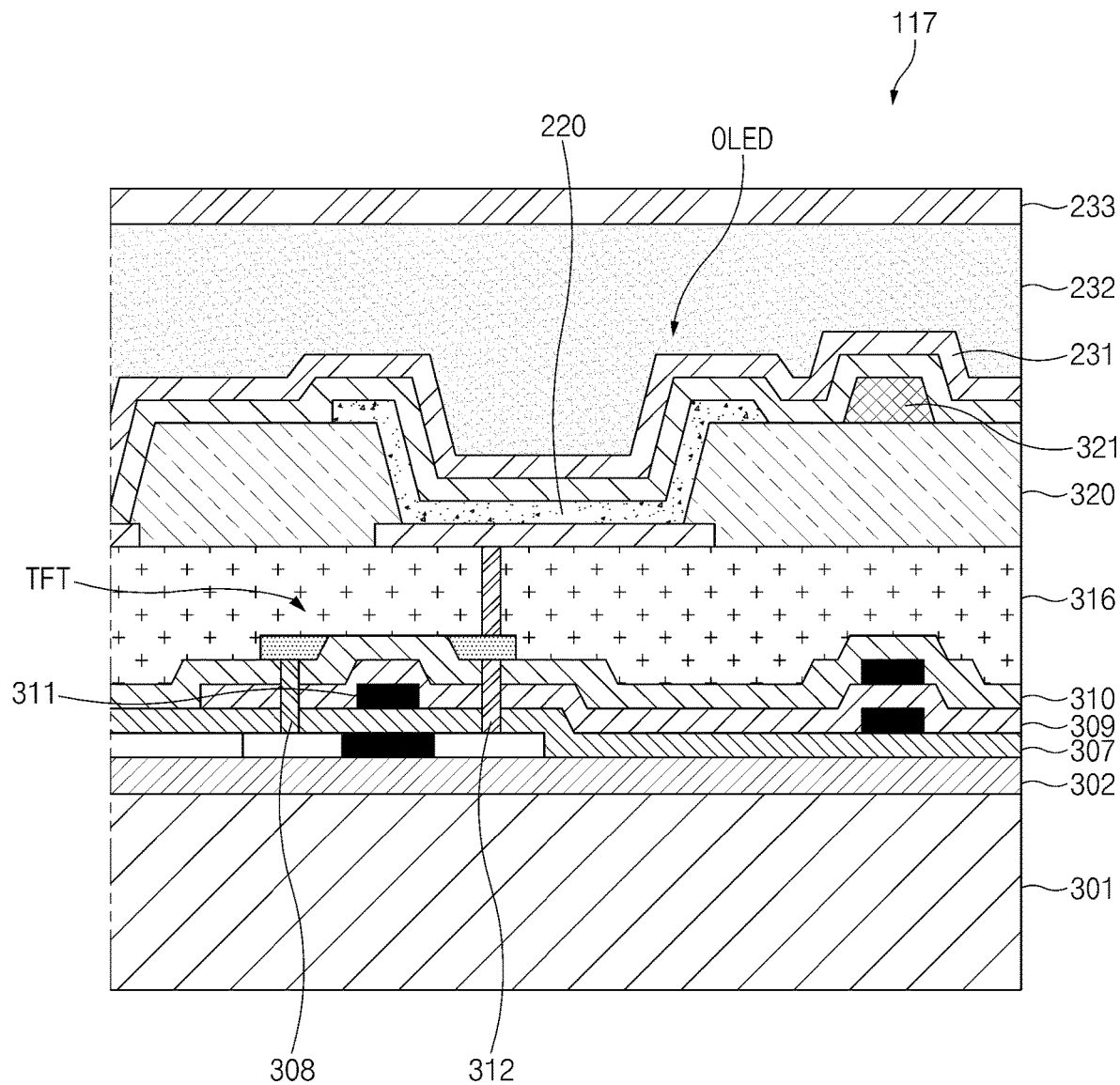

FIGS. 3A, 3B and 3C illustrate the structure of a display panel, according various embodiments.

Referring to FIG. 3A, the display panel 117 includes a substrate layer 210, a light emitting device (or light emitting layer) 220, and an encapsulating layer 230.

The substrate layer (or flexible layer) 210 may be a conductive plate implemented using glass or a complex plastic (e.g., PI, or polyethylene teraphthalate (PET)). The substrate layer 210 may include a metal wiring and an insulating layer to drive each pixel of an active area. For example, the substrate layer 210 may be formed by hardening PI which is in a liquid phase. The PI substrate may have flexibility, so the PI substrate may be used for a flexible display.

The light emitting device 220 may emit light in response to an electrical signal. The light emitting device 220 may include each pixel constituting the display 110. For example, the light emitting device 220 may be implemented with an EL. The EL may generate light when holes and electrons are introduced into the EL from a cathode and an anode, respectively.

The encapsulating layer 230 may surround the light emitting device 220 to block the light emitting device 220 from making contact with a peripheral material. For example, the encapsulating layer 230 may be implemented in a TFE form of surrounding the light emitting device 220 by sequentially stacking thin films. The TFE form may have a thin and flexible feature as compared to a form using glass.

The encapsulating layer 230 may be formed by stacking an inorganic layer and an organic layer to form at least three layers. For example, the encapsulating layer 230 may be formed on the light emitting device 220 by sequentially stacking a first inorganic insulating layer 231, an organic insulating layer 232, and a second inorganic insulating layer 233. The first inorganic insulating layer 231 and the second inorganic insulating layer 233 may have excellent characteristics of preventing air or moisture from being infiltrated based on material characteristics thereof. The organic insulating layer 232 may surround particles on surfaces of the first inorganic insulating layer 231 and the second inorganic insulating layer 233 to planarize the first inorganic insulating layer 231 and the second inorganic insulating layer 233. The organic insulating layer 232 may help the second inorganic insulating layer 233 be disposed in the process of forming the second inorganic insulating layer 233.

Air layers may therefore not be included between the first inorganic insulating layer 231 and the organic insulating layer 232, and between the organic insulating layer 232 and the second inorganic insulating layer 233.

Referring to FIG. 3B, the substrate layer 210 may be implemented with a PET layer 211. The substrate layer 210 includes a first PI 212a disposed on the PET layer 211, a second inorganic insulating layer 212b disposed on the first PI 212a, and a second PI layer 212c disposed on the second inorganic insulating layer 212b. The second inorganic insulating layer 212b may include an SiNx layer. The SiNx layer, which serves as an inorganic barrier layer, may prevent air/moisture from being infiltrated. A third inorganic insulating layer 213 may be interposed between the light emitting device 220 and the second PI layer 212c. For example, the third inorganic insulating layer 213 may be a thin film transistor (TFT) insulating layer. Additionally or alternatively, the third inorganic insulating layer 213 may be a barrier or buffer.

Referring to FIG. 3C, the substrate layer include a substrate 301 and a barrier film 302. According to an embodiment, the substrate layer 210 may further include an additional barrier layer mounted under the substrate 301.

The TFT insulating layer 213 may include a first gate insulating film 307, a second gate insulating film 309, an inter-layer insulating film 310, a protective film 316, a pixel defining layer 320, and a spacer 321. The first gate insulating film 307 and the second gate insulating film 309 may electrically isolate a gate and source electrode 308 from a drain electrode 312. The pixel defining layer 320 may isolate the light emitting device 220 from a peripheral component. The spacer 321 may form a space between the pixel defining layer 320 and the first inorganic insulating layer 231.

The display panel 117 may be implemented in various forms by adding some components or omitting some components.

Figure 4:
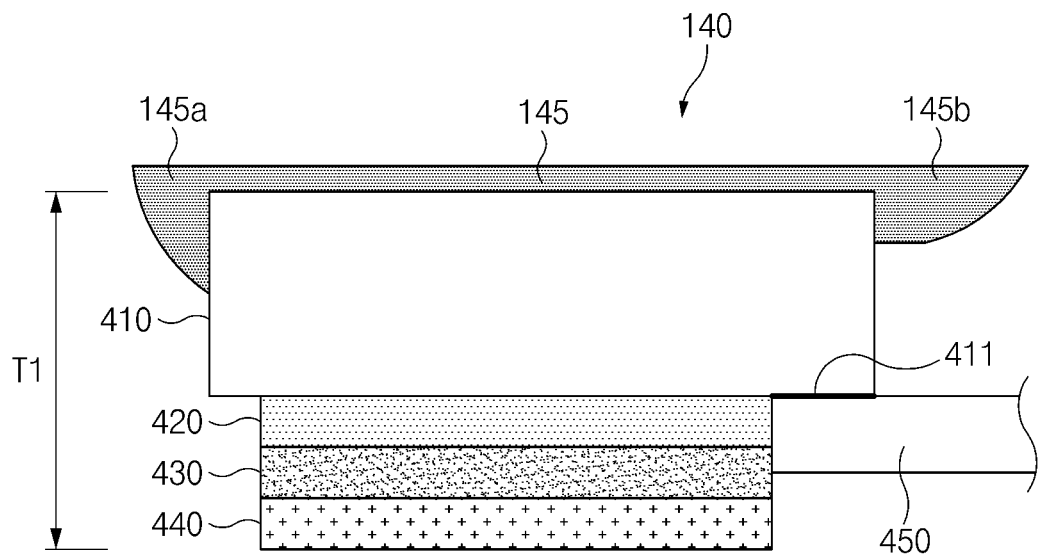
FIG. 4 is a cross-sectional view of a fingerprint sensor, according to an embodiment.

FIG. 4 is a cross-sectional view illustrating the fingerprint sensor and peripheral components, according to an embodiment.

Referring to FIG. 4, the fingerprint sensor 140 may be bonded to the display panel through the sensor bonding layer 145. The sensor bonding layer 145 may be formed by hardening a liquid-phase material having an adhesive property. The sensor bonding layer 145 may include resin, an OCA, a film or a double-sided tape. The sensor bonding layer 145 may be optically opaque (e.g., black).

The sensor bonding layer 145 includes the fillet structures 145a and 145b which are formed to surround at least a portion of at least one side surface of the fingerprint sensor 140. The fillet structures 145a and 145b may be formed in the process when planarizing the adhesive liquid. The fillet structure 145a or 145b reduces the ultrasonic signal which is diffuse reflection to the side surface of the fingerprint sensor 140, thereby enhancing the fingerprint recognition performance.

The first fillet structure 145a and the second fillet structure 145b may have different heights. For example, the height of the first fillet structure 145a may be higher than the height of the second fillet structure 145b adjacent to a wiring part 450.

The fingerprint sensor 140 may include a TFT substrate layer 410, an ultrasonic wave generating layer (or an ultrasonic wave oscillating unit) 420, a metal layer 430, or a planarizing layer 440. The thickness T1 of the fingerprint sensor 140 may be within about 150 um.

The TFT substrate layer 410 may be electrically connected with an internal component (e.g., a PCB) of the electronic device 101 through the wiring part 450. The TFT substrate layer 410 may transmit a control signal necessary for the operation of the fingerprint sensor 140 and an image signal collected from the fingerprint sensor 140. The wiring part 450 may be introduced in the side direction of the fingerprint sensor 140 and connected with the bottom surface (e.g., a surface facing the ultrasonic wave generating layer 420) 411 of the TFT substrate layer 410.

The ultrasonic wave generating layer 420 may generate an ultrasonic wave. The ultrasonic wave generated through the ultrasonic wave generating layer 420 may be output to a first surface (or a sensing surface) (e.g., a surface toward the display 110), a second surface opposite to the first surface, or a side surface (e.g., a surface perpendicular to the first surface or the second surface).

The metal layer 430 may be utilized as a common electrode. For example, the metal layer 430 may include a metallic material, such as silver (Ag) or Cu, having lower resistance.

The planarizing layer 440 may planarize the rear surface (e.g., the second surface) of the fingerprint sensor 140. The planarizing layer 440 may reduce the diffuse reflection of the ultrasonic wave by planarizing an air layer (or air gap) formed on the rear surface of the fingerprint sensor 140, thereby enhancing a fingerprint recognition efficiency. For the flatness of the planarizing layer 440, the height difference on the plane may have a value in the range of about 10 um to about 40 um.

The fillet structures 145a and 145b may have heights sufficient to cover at least a portion of a side surface of the ultrasonic wave generating layer 420. In addition, the fillet structures 145a and 145b may have heights sufficient to cover at least a portion of a side surface of the metal layer 430 or the planarizing layer 440.

Figure 5:
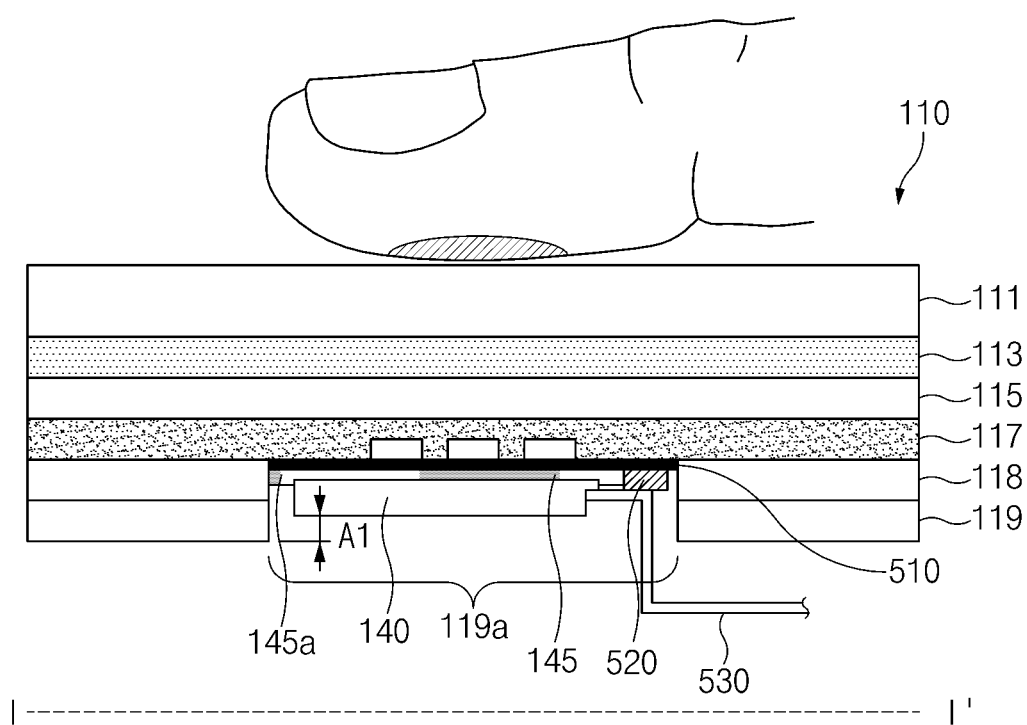
FIG. 5 is a cross-sectional view illustrating an electronic device including a conductive suppressing layer interposed between a fingerprint sensor and a display panel, according to an embodiment.

FIG. 5 is a cross-sectional view illustrating an electronic device including a conductive suppressing layer interposed between the fingerprint sensor and the display panel, according to an embodiment.

Referring to FIG. 5, the display 110 includes a transparent layer (e.g., a window panel or a glass plane) 111, the bonding layer 113, the polarizing layer 115, the display panel 117, the protective layer 118, and the suppressing layer 119.

The functions and the operations of the transparent layer 111, the bonding layer 113, the polarizing layer 115, the display panel 117, the protective layer 118, and the suppressing layer 119 may be the same functions and operations as respective components of FIG. 2.

The electronic device 101 may further include a conductive suppressing layer 510 interposed between the display panel 117 and the fingerprint sensor 140. The conductive suppressing layer 510 may suppress noise (e.g., electromagnetic interference (EMI) noise) caused by an electromagnetic wave, which may be generated from the display panel 117 to prevent the noise from being transmitted to the fingerprint sensor 140. The conductive suppressing layer 510 may be electrically connected with an FPCB inside the electronic device 101 through a conductive tape (e.g., the conductive foam) 520 and the wiring part 530.

The conductive suppressing layer 510 may have an adhesive property. The conductive suppressing layer 510 may be in an adhesive film type or may be a thermosetting adhesive resin or UV curable adhesive resin. The conductive suppressing layer 510 may be formed separately from the sensor bonding layer (e.g., a resin layer or a film type bonding layer) 145.

At least a portion of the conductive suppressing layer 510 or the sensor bonding layer 145 may constitute the fillet structure 145*a* which is a form to cover at least a portion of a side surface of the fingerprint sensor 140. The fillet structure 145*a* may reduce an ultrasonic signal which is diffuse reflected to the side surface of the fingerprint sensor 140, thereby enhancing the fingerprint recognition performance.

The conductive suppressing layer 510 may be a black conductive layer, thereby preventing the fingerprint sensor 140 from being viewed from the outside.

Figure 6:
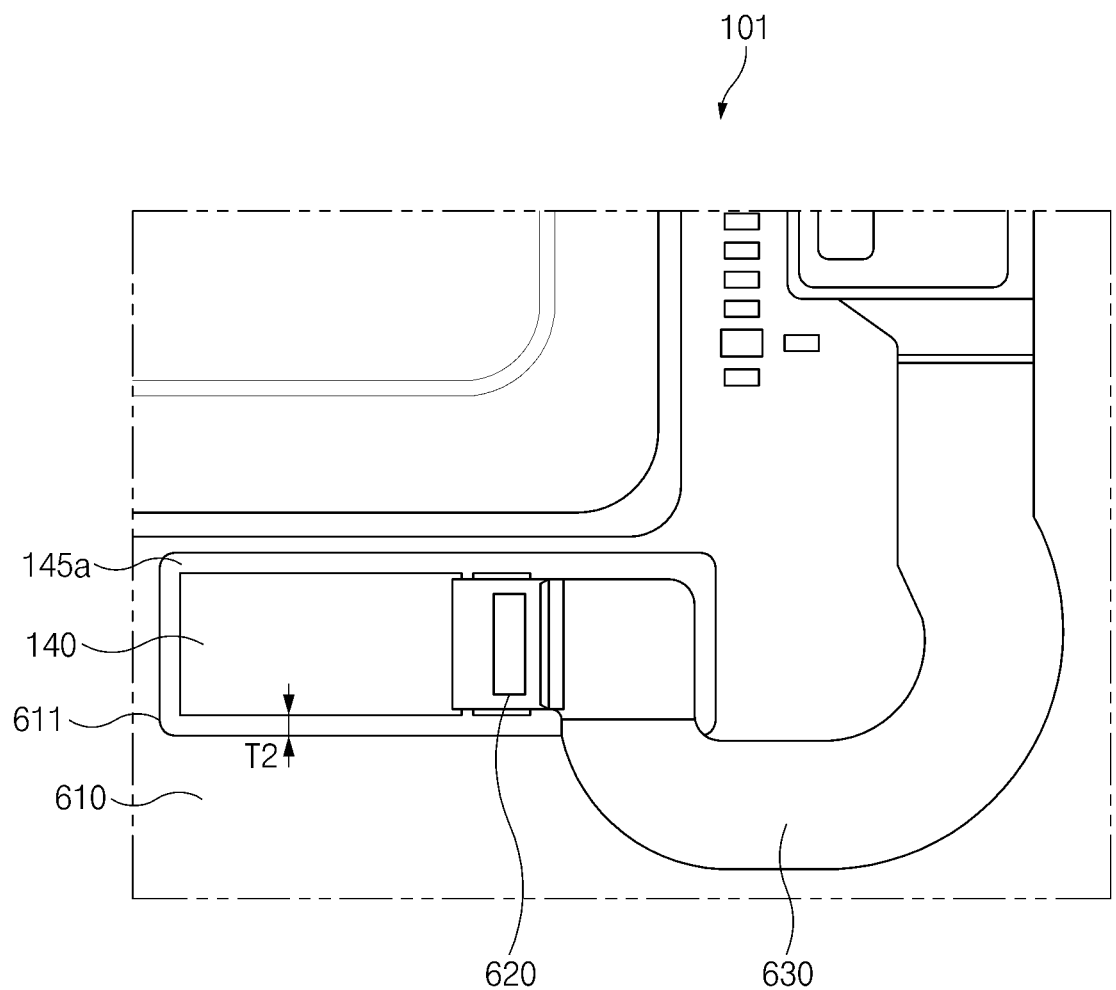
FIG. 6 illustrates a mounting form of a fingerprint sensor when viewed from a rear surface of an electronic device, according to an embodiment.

FIG. 6 illustrates the mounting form of the fingerprint sensor when viewed from the rear surface of the electronic device, according to an embodiment.

Referring to FIG. 6, when viewed from the rear surface (e.g., a surface opposite from a surface that includes an active area of the display 110 or a surface adjacent to the back cover) of the electronic device 101, the fingerprint sensor 140 may be mounted in an opening 611 formed in FPCB 610 to drive the display 110.

The FPCB 610 may process an image signal displayed by each pixel constituting the display panel 117. The FPCB 610 may transmit a control signal of a processor or an image signal to a display driver integrated chip (DDI) of the display panel 117. The FPCB 610 may be mounted in the electronic device 101, making contact with the rear surface of the display panel 117.

The FPCB 610 may include the opening 611 to mount the fingerprint sensor 140. The size of the opening 611 may be greater than the sectional area of the fingerprint sensor 140.

At least a partial side surface of the fingerprint sensor 140 may be maintained with a specified gap (e.g., an air gap) T2 from the side surface of the opening 611. For example, the gap T2 may be equal to or greater than about 0.1 mm or more. The gap T2 may be filled with the fillet structure 145*a* by the sensor bonding layer 145. The fillet structure 145*a* may be formed when planarizing the adhesive liquid. The fillet structure 145*a* may reduce an ultrasonic signal which is diffuse reflected to the side surface of the fingerprint sensor 140, thereby enhancing the fingerprint recognition performance.

A connection part 620 and a wiring part 630 may be connected with one side surface of the fingerprint sensor 140. The connection part 620 and the wiring part 630 may transmit a control signal for the operation of the fingerprint sensor 140 and an image signal collected from the fingerprint sensor 140. An additional fillet structure may not be formed on one surface of the fingerprint sensor 140 connected with the connection part 620 and the wiring part 630.

Figure 7:
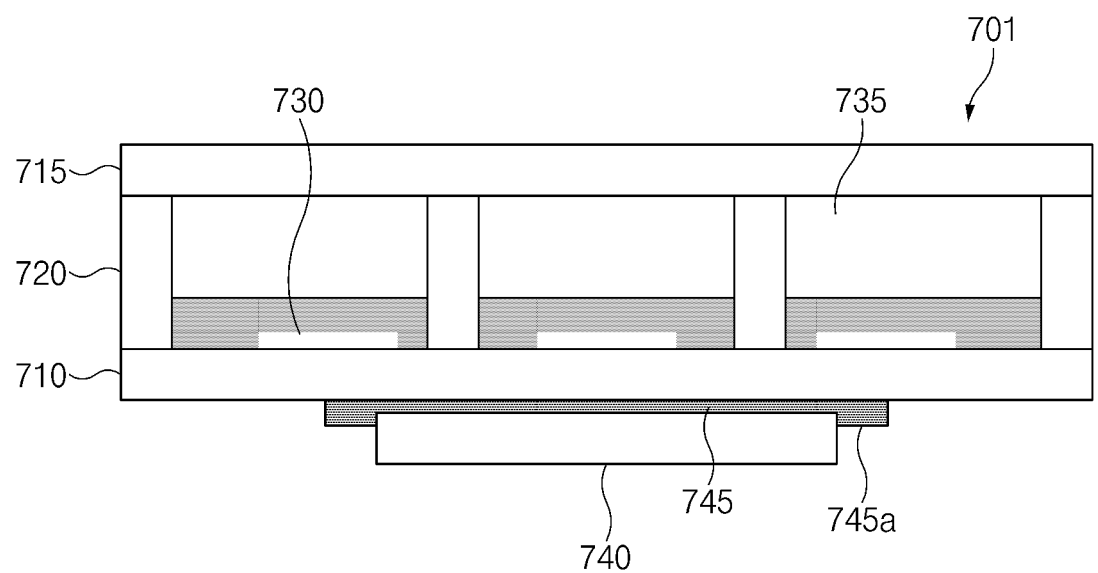
FIG. 7 illustrates a display panel and a fingerprint sensor using electronic ink, according to an embodiment.

FIG. 7 illustrates a display panel and a fingerprint sensor using electronic ink, according to an embodiment.

Referring to FIG. 7, an electronic ink panel 701 includes a first electrode 710, a second electrode 715, a separator 720, a conductive toner 730, and a water-soluble liquid 735.

The first electrode 710 and the second electrode 715 may apply an electrical signal to the conductive toner 730. The separator 720 may separate the conductive toner 730 and the water-soluble liquid 735 from another conductive toner and another water-soluble liquid in the unit of a pixel. The conductive toner 730 and the water-soluble liquid 735 may form a specified pattern in response to an electrical signal of the first electrode 710 and the second electrode 715.

A fingerprint sensor 740 may be bonded to a bottom surface (e.g., a surface opposite to an active area of the display 110 or a surface facing the back cover of the electronic device 101) of the display panel 701 through a sensor bonding layer 745.

The sensor bonding layer 745 may be formed by hardening a liquid-phase material having an adhesive property. The sensor bonding layer 745 may include resin, an OCA, or a film. The sensor bonding layer 745 may include a fillet structure 745*a* which may sufficiently cover at least a portion of a side surface of the fingerprint sensor 740. The fillet structure 745*a* may be formed while planarizing the adhesive liquid. The fillet structure 745*a* may reduce the ultrasonic signal which is diffuse reflected to the side surface of the fingerprint sensor 740, thereby improving the fingerprint recognition performance.

Figure 8:
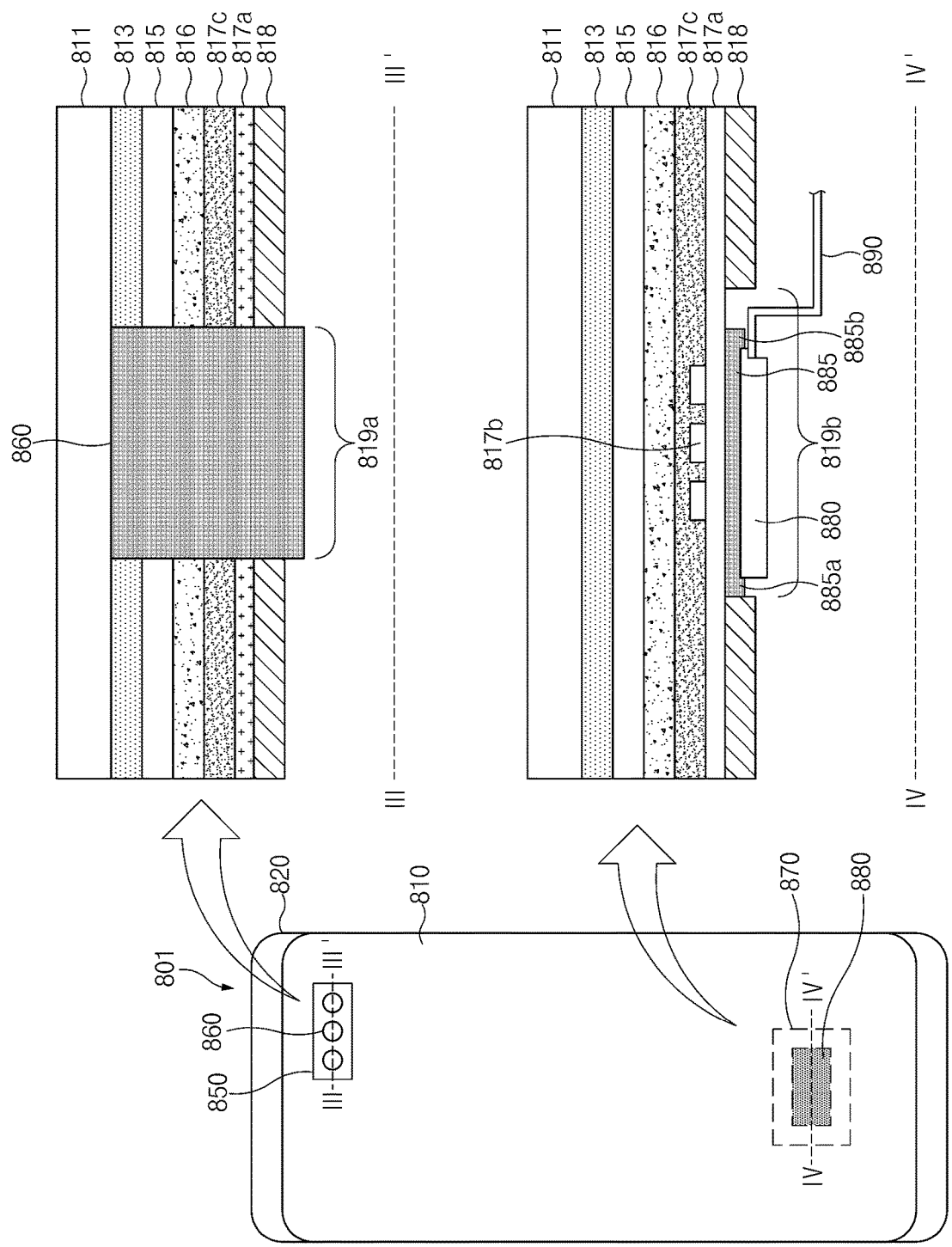
FIG. 8 illustrates an electronic device including a plurality of different types of sensors, according to an embodiment.

FIG. 8 illustrates an electronic device including a plurality of different types of sensors, according to an embodiment.

Referring to FIG. 8, an electronic device 801 includes a display (or display module) 810, a main body (or housing or frame) 820, a first sensor 860, and a second sensor 880. The first sensor 860 and the second sensor 880 may be mounted in areas formed by removing some layers constituting the display 810. The first sensor 860 and the second sensor 880 may be mounted at different depths.

The display 810 may include a first sensing area 850 at a portion thereof (IN-DISPLAY). The first sensing area 850 may be an area for recognizing a surrounding object or a surrounding state of the electronic device 801. The first sensing area 850 may include at least a portion of an active area of the display 810. The electronic device 801 may include a first sensor (e.g., an image sensor, an iris recognition sensor, a camera module, a proximity illuminance sensor or a three dimensional (3D) recognition sensor) 860 provided inside the first sensing area 850 to recognize the surrounding object or the surrounding state of the electronic device 801 in various manners.

The display 810 may include a second sensing area 870 at another portion thereof. For example, the second sensing area 870 may be an area to recognize the fingerprint. When the finger of the user is disposed at the second sensing area 870, the second sensing area 870 may be an area to collect fingerprint information using a sound wave reflected from the fingerprint of the finger. The second sensing area 870 may include at least a portion of the active area of the display 810. The electronic device 801 may include the second sensor 880 provided inside the second sensing area 870 to recognize an external object using an ultrasonic wave.

The display 810 may include various layers. For example, the display 810 may include the structure in which a transparent layer (e.g., a window panel or a glass panel) 811, a bonding layer 813, a polarizing layer 815, a touch panel (e.g., a touch sensor) 816, a substrate layer 817*a*, a light emitting device 817*b*, an encapsulating layer 817*c*, and a protective layer 818 are stacked.

In the display 810, some layers may be added or may be skipped. For example, the display 810 may further include a suppressing layer. Additionally, the position of the touch panel 816 may be changed with the position of the polarizing layer 815 or the touch panel 816 may be interposed between other layers, depending on the type of the touch panel 816.

The functions and the operations of the transparent layer 811, the bonding layer 813, the polarizing layer 815, the substrate layer 817*a*, the light emitting device 817*b*, the encapsulating layer 817*c*, and the protective layer 818 may be the same functions and operations as respective components of FIG. 2 or FIG. 3.

In a cross-sectional view taken along line III-III', the first sensor 860 is mounted inside the first sensing area 850 of the display 810. When the first sensor 860 is a camera module, a lens plane of a camera may be disposed to face the transparent layer 811.

The first sensor 860 may be disposed in an area that is formed by removing some layers of the display 810. For example, the first sensor 860 may be disposed to pass through a first opening formed in at least a portion of the substrate layer (e.g., the flexible layer) 817a and a second opening formed in at least a portion of the protective layer (e.g., the first opaque layer) 818. The second opening may be aligned with the first opening in a direction passing through the display 810, in a size equal to or greater than the size of the first opening. The first sensor 860 may be disposed in a first opening 819a formed by removing different layers of the display 810 instead of the transparent layer 811.

In a cross-sectional view taken along line IV-IV', the second sensor 880 is mounted inside the second sensing area 870 of the display 810. When the second sensor 880 is a fingerprint sensor using an ultrasonic wave, a surface (e.g., a sensing surface), which is used to collect a sound wave, of the second sensor 880 may be disposed toward (e.g., facing in a direction of) the display 810.

The second sensor 880 may be mounted on a part (e.g., an area) formed by removing some layers from the rear surface of the display 810. For example, the second sensor 880 may be disposed at an area formed by partially removing the protective layer 818. The protective layer 818 may define a second opening (e.g., hole) 819b at an area adjacent to the second sensor 880. The second sensor 880 may be seated inside the second opening 819b. The sectional area of the second opening 819b, in which the second sensor 880 is disposed, may be wider than the sectional area of the first opening 819a in which the first sensor 860 is disposed.

The second sensor 880 may be attached to the substrate layer 817a through a sensor bonding layer (or the second opaque layer) 885. The sensor bonding layer 885 may include resin, an OCA, a film or a double-sided tape.

The protective layer 818 (e.g., the first opaque layer) may include a material that is different from at least one material included in the sensor bonding layer 885. For example, the protective layer 818 may be implemented with black resin, and the sensor bonding layer 885 may be implemented with the OCA.

The sensor bonding layer (e.g., the second opaque layer) 885 may not include an air layer, or the air layer may be minimized inside the sensor bonding layer. An amount of air included in the sensor bonding layer 885 may be smaller than an amount of air included in the protective layer 818.

The protective layer 818 may be different from the sensor bonding layer 885 in at least one of stiffness, flexibility, or density.

The protective layer 818 may be disposed spaced apart from the second bonding layer 885. For example, the protective layer 818 and the sensor bonding layer 885 may be disposed spaced apart from each other by a value in the range of 2 mm to 4 mm.

The thickness of the sensor bonding layer 885 may be greater than the thickness of each of the organic insulating layer or inorganic insulating layer in the encapsulating layer 817c.

The sensor bond layer 885 may include fillet structures 885a and 885b which are formed to surround at least a portion of the side surfaces of the second sensor 880. The fillet structures 885a and 885b may be formed in the process of planarizing the adhesive liquid. The fillet structure 885a or 885b reduces the ultrasonic signal which is diffuse reflected to the side surface of the second sensor 880, thereby improving fingerprint recognition performance.

The first fillet structure 885a may make contact with a part of the protective layer 818 adjacent thereto on one side surface of the fingerprint sensor 880. The second fillet structure 885b may not make contact with a part of the protective layer 818 adjacent thereto on another side surface of the second sensor 880. The second fillet structure 885b may be disposed adjacent to a wiring part 890. The first fillet structure 885a and the second fillet structure 885b may have different heights. For example, the height of the first fillet structure 885a may be higher than the height of the second fillet structure 885b adjacent to the wiring part 890.

According to various embodiments, an electronic device includes a display, and a fingerprint sensor disposed under a specified area of the display, wherein the fingerprint sensor is bonded to an inner surface of the display, through a bonding layer, and wherein at least a portion of the bonding layer is expanded in a second direction different from a first direction facing the specified area and forms a protrusion structure to surround at least a portion of a side surface, which faces the second direction, of the fingerprint sensor.

According to various embodiments, the display includes a substrate layer, and the fingerprint sensor is bonded to the substrate layer through the bonding layer.

According to various embodiments, the fingerprint sensor includes a first surface facing the first direction and a second surface opposite to the first surface, and forms, on the second surface, an air gap spaced apart from at least one of a bracket or a metal sheet, which are provided inside the electronic device, by a specified distance.

According to various embodiments, the fingerprint sensor is electrically connected with circuitry provided inside the electronic device through a wiring part introduced in the second direction.

According to various embodiments, the electronic device further includes a conductive suppressing layer interposed between the bonding layer and the display, wherein the conductive suppressing layer includes an adhesive film or resin in black.

According to various embodiments, the fingerprint sensor is bonded to the display by passing through an opening formed in a flexible printed circuit board (FPCB) connected with the display.

According to various embodiments, the display does not include an air layer or void in at least a partial area, which corresponds to a sensing surface of the fingerprint sensor, of the display.

According to various embodiments, the display includes a substrate layer, a plurality of light emitting devices disposed on the substrate layer, and an encapsulating layer configured to cover the plurality of light emitting devices, and wherein the encapsulating layer is formed by alternately stacking an organic insulating layer or an inorganic insulating layer.

According to various embodiments, an electronic device includes a first sensor, a second sensor and a display module that includes a flexible layer having a first opening formed in a first area of the flexible layer, a first opaque layer disposed under the flexible layer and including a second opening aligned with the first opening and a third opening spaced apart from the second opening, and a second opaque layer disposed under the flexible layer through the third opening, wherein the first sensor is disposed to pass through the first opening and the second opening, and wherein the second sensor is disposed under the second opaque layer through the third opening.

According to various embodiments, an area of a top surface of the first sensor is smaller than an area of a top surface of the second sensor.

According to various embodiments, the first opaque layer includes a material different from at least one material included in the second opaque layer.

According to various embodiments, the first opaque layer includes a first amount of air contained inside the first opaque layer, and the second opaque layer include a second amount, which is smaller than the first amount, of air contained in the second opaque layer.

According to various embodiments, the first opaque layer is different from the second opaque layer in at least one of stiffness, flexibility, or density.

According to various embodiments, the electronic device further includes at least one suppressing layer disposed under the first opaque layer, wherein the at least one suppressing layer includes a metal sheet.

According to various embodiments, the first sensor is an image sensor, and the second sensor is an ultrasonic fingerprint sensor.

According to various embodiments, the first opaque layer and the second opaque layer are disposed to be at least partially spaced apart from each other.

According to various embodiments, the display module further includes an organic light emitting layer disposed on the flexible layer, a first organic insulating layer disposed on the organic light emitting layer and configured to at least partially prevent air or moisture from being infiltrated, and a first inorganic insulating layer disposed on the first organic insulating layer and configured to at least partially prevent air or moisture from being infiltrated.

According to various embodiments, an air layer is absent between the first organic insulating layer and the second sensor.

According to various embodiments, the electronic device further includes a support member disposed under the second sensor, and an air gap interposed between the second sensor and the support member.

According to various embodiments, the display module includes a polarizing layer disposed on the flexible layer, and including a fourth opening formed corresponding to the first opening, and a touch sensor including a fifth opening formed corresponding to the first opening, wherein the first sensor is disposed to pass through the polarizing layer and the touch sensor through the fourth opening and the fifth opening.

Figure 9:
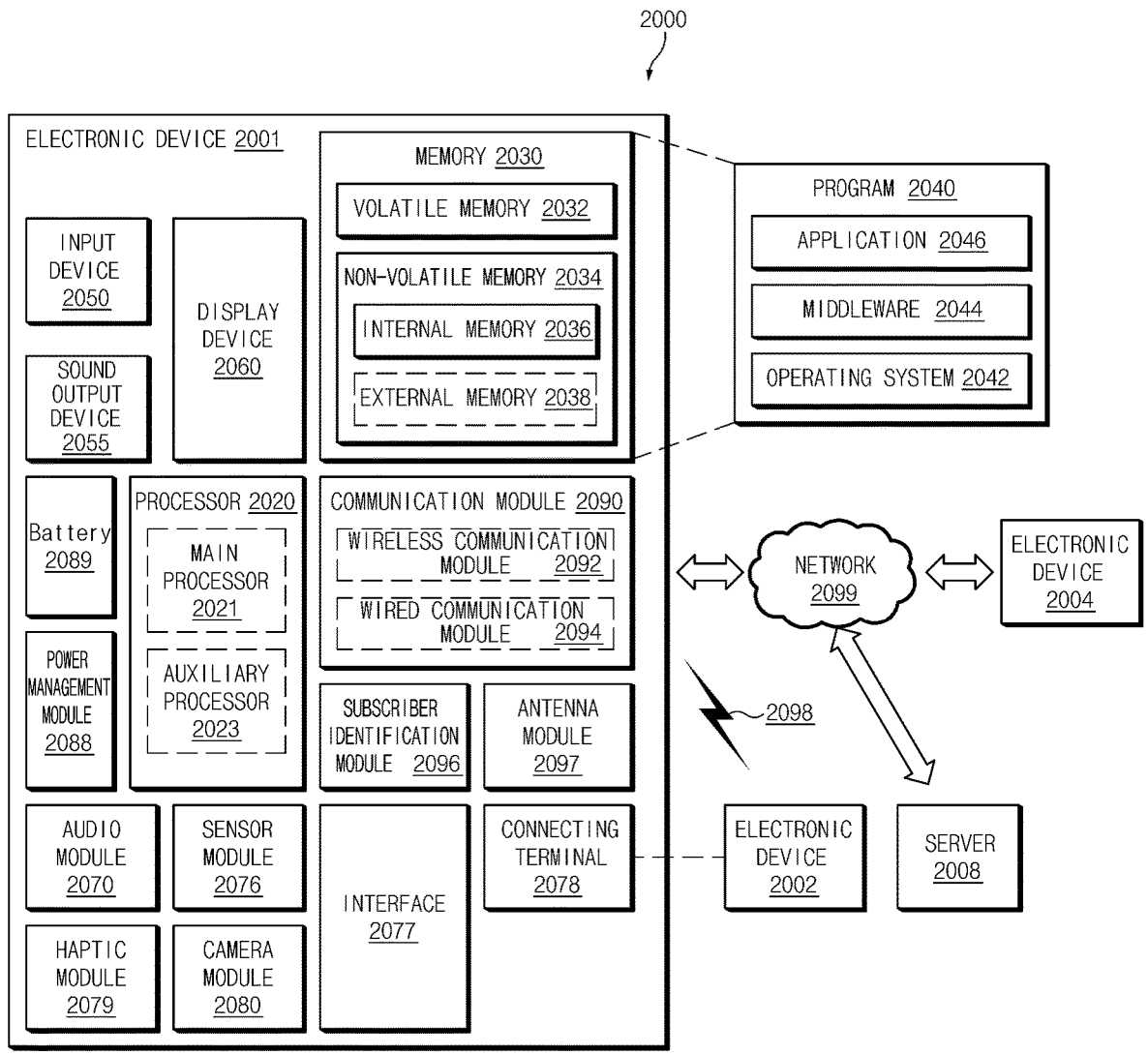
FIG. 9 is a block diagram illustrating an electronic device in a network environment, according to an embodiment.

FIG. 9 is a block diagram of an electronic device 2001 in a network environment 2000, according to various embodiments.

Referring to FIG. 9, the electronic device 2001 in the network environment 2000 may communicate with an electronic device 2002 over a first network 2098 (e.g., a short range wireless communication network) or may communicate with an electronic device 2004 or a server 2008 over a second network 2099 (e.g., a long distance wireless communication network). According to an embodiment, the electronic device 2001 may communicate with the electronic device 2004 through the server 2008. According to an embodiment, the electronic device 2001 may include a processor 2020, a memory 2030, an input device 2050, a sound output device 2055, a display device 2060, an audio module 2070, a sensor module 2076, an interface 2077, a haptic module 2079, a camera module 2080, a power management module 2088, a battery 2089, a communication module 2090, a subscriber identification module 2096, or an antenna module 2097. In any embodiment, at least one (e.g., the display device 2060 or the camera module 2080) of the components may be omitted from the electronic device 2001, or one or more other components may be further included in the electronic device 2001. In any embodiment, some of the components may be implemented with a single integrated circuit. For example, the sensor module 2076 (e.g., a fingerprint sensor, an iris sensor, or an illumination sensor) may be embedded in the display device 2060 (e.g., a display).

The processor 2020 may execute, for example, software (e.g., a program 2040) to control at least one other component (e.g., a hardware or software component) of the electronic device 2001 connected to the processor 2020, and may perform various data processing or operations. According to an embodiment, as at least a part of the data processing or operations, the processor 2020 may load a command or data received from any other component (e.g., the sensor module 2076 or the communication module 2090) to a volatile memory 2032, may process the command or data stored in the volatile memory 2032, and may store processed data in a nonvolatile memory 2034. According to an embodiment, the processor 2020 may include a main processor 2021 (e.g., a central processing unit or an application processor) and an auxiliary processor 2023 (e.g., a graphic processing device, an image signal processor, a sensor hub processor, or a communication processor), which may be operated independently of or together with the main processor 2021. Additionally or alternatively, the auxiliary processor 2023 may be configured to use lower power than the main processor 2021 or to be specialized for a specified function. The auxiliary processor 2023 may be implemented separately from the main processor 2021 or may be implemented as a part of the main processor 2021.

The auxiliary processor 2023 may control at least a part of a function or states associated with at least one component (e.g., the display device 2060, the sensor module 2076, or the communication module 2090) of the electronic device 2001, for example, instead of the main processor 2021 while the main processor 2021 is in an inactive (e.g., sleep) state and together with the main processor 2021 while the main processor 2021 is in an active (e.g., an application execution) state. According to an embodiment, the auxiliary processor 2023 (e.g., an image signal processor or a communication processor) may be implemented as a part of any other component (e.g., the camera module 2080 or the communication module 2090) which is functionally (or operatively) associated with the auxiliary processor 2023.

The memory 2030 may store various data which are used by at least one component (e.g., the processor 2020 or the sensor module 2076) of the electronic device 2001. The data may include, for example, software (e.g., the program 2040), or input data or output data associated with a command of the software. The memory 2030 may include the volatile memory 2032 or the nonvolatile memory 2034. The nonvolatile memory 2034 may include an internal memory 2036 or an external memory 2038.

The program 2040 may be stored in the memory 2030 as software, and may include, for example, an operating system 2042, a middleware 2044, or an application 2046.

The input device 2050 may receive a commands or data which will be used by a component (e.g., the processor 2020) of the electronic device 2001, from the outside (e.g., a user) of the electronic device 2001. The input device 2050 may include, for example, a microphone, a mouse, or a keyboard.

The sound output device 2055 may output a sound signal to the outside of the electronic device 2001. The sound output device 2055 may include, for example, a speaker or a receiver. The speaker may be used for a general purpose such as multimedia play or recording play, and the receiver may be used to receive an incoming call. According to an embodiment, the receiver may be implemented separately from the speaker or may be implemented as a part of the speaker.

The display device 2060 may visually provide information to the outside (e.g., the user) of the electronic device 2001. The display device 2060 may include, for example, a display, a hologram device, or a control circuit for controlling a projector and a corresponding device. According to an embodiment, the display device 2060 may include a touch circuitry configured to sense a touch, or a sensor circuitry (e.g., a pressure sensor) configured to measure the strength of force generated by the touch.

The audio module 2070 may convert sound to an electrical signal, or reversely, may convert an electrical signal to sound. According to an embodiment, the audio module 2070 may obtain sound through the input device 2050, or may output sound through the sound output device 2055, or through an external electronic device (e.g., the electronic device 2002) (e.g., a speaker or a headphone) directly or wirelessly connected with the electronic device 2001.

The sensor module 2076 may sense an operation state (e.g., power or a temperature) of the electronic device 2001 or an external environment state (e.g., a user state), and may generate an electrical signal or a data value corresponding to the sensed state. According to an embodiment, the sensor module 2076 may include, for example, a gesture sensor, a grip sensor, a barometric pressure sensor, a magnetic sensor, an acceleration sensor, a grip sensor, a proximity sensor, a color sensor, an infrared (IR) sensor, a biometric sensor, a temperature sensor, a humidity sensor, or an illumination sensor.

The interface 2077 may support one or more specified protocols that may be used to directly and wirelessly connect the electronic device 2001 with an external electronic device (e.g., the electronic device 2002). According to an embodiment, the interface 2077 may include, for example, a high definition multimedia interface (HDMI), a universal serial bus (USB) interface, a secure digital (SD) card interface, or an audio interface.

A connection terminal 2078 may include a connector that may allow the electronic device 2001 to be physically connected with an external electronic device (e.g., the electronic device 2002). According to an embodiment, the connection terminal 2078 may include, for example, a HDMI connector, a USB connector, a SD card connector, or an audio connector (e.g., a headphone connector).

The haptic module 2079 may convert an electrical signal to a mechanical stimulation (e.g., vibration or movement) or an electrical stimulation which the user may perceive through the sense of touch or the sense of movement. According to an embodiment, the haptic module 2079 may include, for example, a motor, a piezoelectric sensor, or an electrical stimulation device.

The camera module 2080 may photograph a still image and a video. According to an embodiment, the camera module 2080 may include one or more lenses, image sensors, image signal processors, or flashes (or electrical flashes).

The power management module 2088 may manage the power which is supplied to the electronic device 2001. According to an embodiment, the power management module 2088 may be implemented, for example, as at least a part of a power management integrated circuit (PMIC).

The battery 2089 may power at least one component of the electronic device 2001. According to an embodiment, the battery 2089 may include, for example, a primary cell not recharged, a secondary cell rechargeable, or a fuel cell.

The communication module 2090 may establish a direct (or wired) communication channel or a wireless communication channel between the electronic device 2001 and an external electronic device (e.g., the electronic device 2002, the electronic device 2004, or the server 2008) or may perform communication through the established communication channel. The communication module 2090 may include one or more communication processors which is operated independently of the processor 2020 (e.g., an application processor) and supports direct (or wired) communication or wireless communication. According to an embodiment, the communication module 2090 may include a wireless communication module 2092 (e.g., a cellular communication module, a short range wireless communication module, or a global navigation satellite system (GNSS) communication module) or a wired communication module 2094 (e.g., a local area network (LAN) communication module or a power line communication module). A corresponding communication module of such communication modules may communicate with an external electronic device over the first network 2098 (e.g., a short range communication network such as Bluetooth, Wi-Fi direct, or infrared data association (IrDA)) or the second network 2099 (e.g., a long distance communication network such as a cellular network, an Internet, or a computer network (e.g., LAN or WAN)). The above-described kinds of communication modules may be integrated in one component (e.g., a single chip) or may be implemented with a plurality of components (e.g., a plurality of chips) which are independent of each other. The wireless communication module 2092 may verify and authenticate the electronic device 2001 within a communication network, such as the first network 2098 or the second network 2099, by using subscriber information (e.g., international mobile subscriber identity (IMSI)) stored in the subscriber identification module 2096.

The antenna module 2097 may transmit a signal or a power to the outside (e.g., an external electronic device) or may receive a signal or a power from the outside. According to an embodiment, the antenna module 2097 may include one or more antennas, and at least one antenna which is suitable for a communication scheme used in a computer network such as the first network 2098 or the second network 2099 may be selected, for example, by the communication module 2090 from the one or more antennas. The signal or power may be exchanged between the communication module 2090 and an external electronic device through the selected at least one antenna or may be received from the external electronic device through the selected at least one antenna and the communication module 2090.

At least some of the components may be connected to each other through a communication scheme (e.g., a bus, a general purpose input and output (GPIO), a serial peripheral interface (SPI), or a mobile industry processor interface (MIPI)) between peripheral devices and may exchange signals (e.g., commands or data) with each other.

According to an embodiment, a command or data may be transmitted or received (or exchanged) between the electronic device 2001 and the external electronic device 2004 through the server 2008 connecting to the second network 2099. Each of the electronic devices 2002 and 2004 may be a device, the kind of which is the same as or different from a kind of the electronic device 2001. According to an embodiment, all or a part of operations to be executed in the electronic device 2001 may be executed in one or more external devices of the external electronic devices 2002, 2004, or 2008. For example, in the case where the electronic device 2001 should perform any function or service automatically or in response to a request from the user or any other device, the electronic device 2001 may request one or more external electronic devices to perform at least a part of the function or service, instead of internally executing the function or service or additionally. The one or more external electronic devices which receive the request may execute at least a part of the function or service thus requested or an additional function or service associated with the request, and may provide a result of the execution to the electronic device 2001. The electronic device 2001 may process received result as it is or additionally, and may provide a result of the processing as at least a part of the response to the request. To this end, for example, a cloud computing, distributed computing, or client-server computing technology may be used.

As described above, in the electronic device, the air layer inside the display panel is removed, thereby preventing the path of an ultrasonic wave, which is generated by an ultrasonic sensor, from being reflected/refracted by the air layer. Accordingly, the performance of recognizing the fingerprint in the ultrasonic fingerprint sensor may be improved.

The electronic device may reduce the diffuse reflection (e.g., may reduce the scattering of light in the reflection) of the ultrasonic wave through a protrusion structure (e.g., a fillet structure) formed by expanding the bonding layer on the surface of the ultrasonic fingerprint sensor.

While the present disclosure has been particularly shown and described with reference to certain embodiments thereof, it will be understood by those of ordinary skill in the art that various changes in form and details may be made therein without departing from the spirit and scope of the disclosure as defined by the appended claims and their equivalents.

What is claimed is:

1. An electronic device comprising:
   a display; and
   a fingerprint sensor disposed under a specified area of the display, wherein
   the fingerprint sensor is bonded to an area from which at least one layer of a plurality of layers constituting the display has been removed, through a bonding layer, wherein
   at least a portion of the bonding layer is expanded to at least a portion of a side surface of the fingerprint sensor to form a first protrusion structure and a second protrusion structure to surround the at least a portion of the side surface of the fingerprint sensor, wherein
   the first protruding structure is in contact with a first surface of a cross-section of the at least one layer and the second protruding structure is separated from an opposing second surface of the cross-section of the at least one layer, wherein
   the fingerprint sensor is electrically connected to a printed circuit board inside the electronic device through a wiring part, wherein
   the wiring part is connected to the fingerprint sensor in a vicinity of the second protruding structure, and wherein
   a sensing surface of the fingerprint sensor faces the specified area.

2. The electronic device of claim 1, wherein the display includes:
   a substrate layer, and
   wherein the fingerprint sensor is bonded to the substrate layer through the bonding layer.

3. The electronic device of claim 1, wherein the fingerprint sensor includes a surface opposite to the sensing surface,
   wherein an air gap spaced apart from at least one of a bracket or a metal sheet, which are provided inside the electronic device, by a specified distance is formed on the surface opposite to the sensing surface.

4. The electronic device of claim 1, further comprising:
   a conductive suppressing layer interposed between the bonding layer and the display,
   wherein the conductive suppressing layer includes an adhesive film or resin in black.

5. The electronic device of claim 1, wherein the fingerprint sensor is bonded to the display by passing through an opening formed in a flexible printed circuit board (FPCB) connected with the display.

6. The electronic device of claim 1, wherein the display does not include an air layer or void in at least a partial area, which corresponds to the sensing surface of the fingerprint sensor, of the display.

7. The electronic device of claim 1, wherein the display includes:
   a substrate layer;
   a plurality of light emitting devices disposed on the substrate layer; and
   an encapsulating layer configured to cover the plurality of light emitting devices, and
   wherein the encapsulating layer is formed by alternately stacking an organic insulating layer or an inorganic insulating layer.

8. An electronic device comprising:
   a first sensor;
   a second sensor; and
   a display module that includes:
   a flexible layer having a first opening formed in a first area of the flexible layer;
   a first opaque layer disposed under the flexible layer and including a second opening aligned with the first opening and a third opening spaced apart from the second opening; and
   a second opaque layer disposed under the flexible layer through the third opening, wherein
   the first sensor is disposed to pass through the first opening and the second opening, wherein
   the second sensor is disposed under the second opaque layer through the third opening, wherein
   a bonding layer between the display module and the second sensor is expanded to at least a portion of a side surface of the second sensor to form a first protrusion structure and a second protrusion structure to surround the at least the portion of the side surface of the second sensor, wherein
   the first protruding structure is in contact with a first surface of the third opening and the second protruding structure is separated from an opposing second surface of the third opening, wherein
   the fingerprint sensor is electrically connected to a printed circuit board inside the electronic device through a wiring part, wherein
   the wiring part is connected to the fingerprint sensor in a vicinity of the second protruding structure, and wherein a sensing surface of the second sensor faces the display module.

9. The electronic device of claim 8, wherein an area of a top surface of the first sensor is smaller than an area of a top surface of the second sensor.

10. The electronic device of claim 8, wherein the first opaque layer includes a material different from at least one material included in the second opaque layer.

11. The electronic device of claim 8, wherein the first opaque layer includes a first amount of air contained inside the first opaque layer, and
wherein the second opaque layer include a second amount, which is smaller than the first amount, of air contained in the second opaque layer.

12. The electronic device of claim 8, wherein the first opaque layer is different from the second opaque layer in at least one of stiffness, flexibility, or density.

13. The electronic device of claim 8, further comprising:
at least one suppressing layer disposed under the first opaque layer,
wherein the at least one suppressing layer includes a metal sheet.

14. The electronic device of claim 8, wherein the first sensor is an image sensor, and
wherein the second sensor is an ultrasonic fingerprint sensor.

15. The electronic device of claim 8, wherein the first opaque layer and the second opaque layer are disposed to be at least partially spaced apart from each other.

16. The electronic device of claim 8, wherein the display module further includes:
an organic light emitting layer disposed on the flexible layer;
a first organic insulating layer disposed on the organic light emitting layer and configured to at least partially prevent air or moisture infiltration; and
a first inorganic insulating layer disposed on the first organic insulating layer and configured to at least partially prevent air or moisture infiltration.

17. The electronic device of claim 16, wherein an air layer is absent between the first organic insulating layer and the second sensor.

18. The electronic device of claim 8, further comprising:
a support member disposed under the second sensor; and
an air gap interposed between the second sensor and the support member.

19. The electronic device of claim 8, wherein the display module includes:
a polarizing layer disposed on the flexible layer, and including a fourth opening formed corresponding to the first opening; and
a touch sensor including a fifth opening formed corresponding to the first opening,
wherein the first sensor is disposed to pass through the polarizing layer and the touch sensor through the fourth opening and the fifth opening.

* * * * *